United States Patent
Ruan

(10) Patent No.: US 9,052,507 B1
(45) Date of Patent: Jun. 9, 2015

(54) MICRO-ELECTRO-MECHANICAL MOTION TRANSDUCER

(71) Applicant: Ju-Ai Ruan, Plano, TX (US)

(72) Inventor: Ju-Ai Ruan, Plano, TX (US)

(*) Notice: Subject to any disclaimer, the term of this patent is extended or adjusted under 35 U.S.C. 154(b) by 366 days.

(21) Appl. No.: 13/764,798

(22) Filed: Feb. 12, 2013

(51) Int. Cl.
  *H02N 1/00* (2006.01)
  *G02B 26/00* (2006.01)
  *G02B 26/02* (2006.01)

(52) U.S. Cl.
  CPC ..................... *G02B 26/02* (2013.01)

(58) Field of Classification Search
  CPC ... B82Y 20/00; H04N 9/3197; G03F 7/70291
  USPC .......... 310/309; 359/237, 238, 245, 246, 259, 359/290–295, 298, 315, 316, 318, 618; 362/297, 330, 626; 372/43, 45, 46.01; 355/67, 71
  See application file for complete search history.

(56) References Cited

U.S. PATENT DOCUMENTS

| | | | |
|---|---|---|---|
| 7,995,263 B1* | 8/2011 | Ruan .............................. | 359/290 |
| 2009/0168146 A1* | 7/2009 | Hornbeck ..................... | 359/291 |
| 2014/0267331 A1* | 9/2014 | Villarreal et al. ............. | 345/531 |

* cited by examiner

*Primary Examiner* — Thomas Dougherty

(57) ABSTRACT

A novel method of modulating the motion or displacement of function units in MEMS (micro-electro-mechanical-system) devices (or MEMS motion transducers) is described. This method generates small vertical displacement of one MEMS component (activation component) in the device and effectively translates that displacement into the displacement of another MEMS component (function unit) in the same device in an in-plan direction that is perpendicular to the direction of the vertical displacement of activation component. The activation component has a large surface area of electrostatic interaction with its interacting electrode, capable of generating large activation force at small voltages. Therefore this method makes it effective to modulate the motion or displacement of the function unit of MEMS motion transducers in an in-plan direction at low voltages. Specific designs of MEMS motion transducers employing this method are disclosed.

10 Claims, 8 Drawing Sheets

MICRO-ELECTRO-MECHANICAL MOTION TRANSDUCER

TECHNICAL FIELD OF THE INVENTION

This invention is generally directed to MEMS (micro-electro-mechanical-system) devices having a function that requires some of the MEMS components to have lateral motion or displacement), or in-plan motion, a motion that is in the direction parallel to the constituting thin film layers within the MEMS device. One special application is directed towards MEMS spatial light modulators, more particularly but not limited to, flat panel display devices using MEMS light modulators and fabrication thereof.

BACKGROUND OF THE INVENTION

MEMS devices are becoming more widely used in many applications. Some of the applications require some of the MEMS components to move with relatively large amplitude in a lateral direction, or in-plan direction, sometimes also referred as horizontal direction. Here the definition of lateral direction, in-plan direction, or horizontal direction, is generally in reference to MEMS manufacturing processes. In typical MEMS manufacturing, various thin film layers (metal and dielectric) are deposited onto a starting substrate. Patterning and etching processes are applied to the thin film layers to form venous patterns in each layer. The patterns and the layers are device specific. The layer-by-layer stacking direction, perpendicular to the surface of starting substrate onto which the thin film layers are deposited, is generally called vertical direction. The directions within the layers, parallel to the surface of the starting substrate (perpendicular to film stacking direction), are called in-plan, lateral, or horizontal directions. Subsequent discussions follow this convention. The term of in-plan direction, lateral direction and horizontal direction may be used interchangeably.

For example, in display industry, several methods are being developed to use MEMS devices for display application to improve energy efficiency over liquid crystal display (LCD) and plasma display (PD). This is motivated by the fact that both LCD and PD are relatively inefficient in energy use. For example, polarizer alone in LCD reduces light intensity by fifty percent, while PD consumes significantly more power per lumen than LCD. There exist a number of disclosures and publications on using MEMS devices for display applications with substantially reduced energy consumption. One example was recently disclosed in a US patent (U.S. Pat. No. 7,995,263 B1) in which a method of using light separators and MEMS light shutters for image display was disclosed. The light separator is used to direct light illuminated on its incident surface into individual pixels, and to condense the light within each pixel to a small light exit groove, which takes only a small fraction of pixel area on the exit surface (viewing surface) of the light separator. Light shutters are built on top of the light distributor to control the color and intensity of light at individual pixels. In this cited example, torsional light shutters swinging around their hinges are employed as examples to control the color and intensity of light. It would be more efficient and advantageous to use shutters with relatively large amplitude of in-plan motion (horizontal motion). For example, an amplitude of horizontal motion greater than 10 um for pixel size of around 80 um, and larger amplitude of horizontal motion for larger pixel sizes.

In order for shutters to have horizontal motion, it is generally necessary to have a force in horizontal direction to move them between their "ON" and "OFF" positions. If the force is of electrostatic nature, this would generally require either a large interaction surface oriented perpendicular to the direction of the horizontal motion or a large driving voltage, or their combination of, in order to generate a force large enough to move the shutters between their "ON" and "OFF" positions. This is because electrostatic force is proportional to the area of the interacting surfaces, but inversely proportional to the square of their separation. A large separation between the interacting surfaces (associated with the large amplitude of horizontal motion of one of the interacting MEMS components) requires larger interaction area and/or higher voltage in order to generate a force large enough to move the shutters.

Large interaction surface oriented in the direction perpendicular to horizontal motion requires a structure that is essentially similar to a vertical wall. This structure can be made available but generally at the cost of increased manufacturing complexity; while applying high voltages across interacting surfaces will generally consumes more electric power and may also cause device reliability issues. In some applications such as mobile application of handheld devices, applying high voltage to any part of the device is simply not practical.

On the other hand, large electrostatic force in vertical direction can be obtained more easily in MEMS devices. A typical MEMS manufacturing process flow involves layer-by-layer semiconductor processes. Large interaction surface in a thin film layer (i.e., the normal of the surface is in the same direction as film stacking direction) can easily be made available. The separation (distance) between different layers can be controlled with an accuracy of well below a fraction of micron. Thus the separation between interacting surfaces can be made small and precise for two adjacent layers interact with each other. As a result, large interaction force in vertical direction can be obtained with small separation between the interacting surfaces and large interacting surfaces area.

A vertical force will generally only result a relative displacement of the interacting surfaces in vertical direction. If the separation between interacting surfaces is small, the amplitude of vertical displacement is also small. In many applications, it requires some MEMS component to move in horizontal direction with large amplitude. It would therefore be useful to have a method that can effectively convert a small vertical displacement in some part of a MEMS device into motion of other MEMS components in horizontal direction and with larger amplitude.

SUMMARY OF THE INVENTION

According to the present invention, a method of making a new type of MEMS motion transducers is derived. These new motion transducers make use of interaction force in vertical direction within the MEMS device to generate a vertical displacement within one part of the MEMS device (activation component), and convert that vertical displacement into horizontal displacement of a different part of the MEMS device (function unit). The amplitude of horizontal displacement of the function unit can be larger than that of the vertical displacement of the activation component.

The following sections present a simplified summary of the invention in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One aspect of the present invention comprises generating an electrostatic force within the activation component of a MEMS device, with the force in vertical direction, to control the horizontal motion of functional component of the device. As MEMS manufacturing typically involves layer-by-layer processes, relatively large surface area of electrostatic interaction can be made available within each layer, independent of the thickness of the layer. In addition, the separation between the interacting layers can be made precise and sufficiently small. Therefore large electrostatic interaction force in the MEMS device can be obtained even using relatively small voltages across the interacting surfaces. This is seen from the general equation of electrostatic interaction force between two parallel plates:

$$F = \frac{1}{2}\varepsilon\frac{AV^2}{d^2},$$

when A is the area of electrostatic interaction, d the separation between two interacting surfaces and V the voltage across the two surfaces. Both larger surface area and smaller separation between the interacting surfaces yield larger electrostatic force at a given voltage.

For this aspect of the invention, the MEMS devices (motion transducers) generally consist of a base plate that provides physical support to the device, and the following three units (or components): A motion activation unit (or activation unit), a motion conversion unit, and a function unit (function component). The base plate is the starting substrate onto which the MEMS motion transducers are fabricated. Some integrated circuits (ICs) may have already been fabricated in the base plate to control the motion transducers.

The motion activation unit comprises (1) a base electrode, (2) a drive plate, (3) drive plate support posts, (4) and drive plate support hinges. The motion activation unit is used to generate the motion of the drive plate. The base electrode provides an area for electrostatic interaction with the drive plate. The drive plate support posts are fixed to the top of base plate. For each drive plate, one end of it is connected to two drive plate support posts through two drive plate support hinges. This end of drive plate is referred as the fixed end of drive plate as it cannot move towards the corresponding base electrode. The other end of drive plate has the freedom to move in vertical direction, referred as the free end of drive plate. Under the interaction force with base plate, the free end of drive plate moves toward base electrode. In the absence of electrostatic interaction, the free end returns to its neutral position under the internal restoration force (details to be described later) within the motion transducer. The drive plate thus swings around its support hinges, with its free end moves primarily in vertical direction (along with a much smaller horizontal component) as the electrostatic force is turned on and off.

The motion conversion unit converts the vertical motion of the free end of drive plate into motion in a horizontal direction in a different part of the device, the function unit of the MEMS device. The amplitude of horizontal motion of the function unit can be larger than that of the vertical motion of the free end of drive plate.

There can be many ways of making the motion conversion unit. In a simple example, the motion conversion unit comprises the reverse of a first class lever, which consists of a first arm (effort arm), a second arm (load arm), and a fulcrum. In a typical first class lever, the first arm (effort arm) is longer than the second arm (load arm), so that it takes less effort to lift a load. However, in this invention, the purpose of the lever is for motion transfer, to convert the relatively small vertical motion (or displacement) of the free end of drive plate into motion in a horizontal direction of the function unit of MEMS device. Thus the second arm can be made longer than the first arm to make the motion conversion more effective. To avoid confusion with references to conventional first class levers, the arms in MEMS devices described in this invention will only be referenced as "first arm" and "second arm", instead of "effort arm" and "load arm", in subsequent descriptions.

The fulcrum of each lever comprises two lever support hinges, each of which connects the lever to a lever support post. The lever support posts are also fixed onto the top of base plate, providing physical support to the lever through lever support hinges. The arms of the lever can swing around the hinges.

The free end of drive plate in motion activation unit is connected to the end of the first arm of the lever through a coupling spring (or coupling springs). As drive plate swings around its support hinges, this coupling spring carries the end of the first arm up and down accordingly, causing the lever to swing around its fulcrum. As the lever swings around its fulcrum, the end of its second arm swings with a larger amplitude than the first arm, in a trajectory of an arc with primarily vertical motion component (along with a small horizontal component).

The second arm is connected to the function unit of the device through flexible fixtures that are part of the motion conversion unit, more details will be described in later sections. The motion conversion unit contains motion restriction springs that restrict the function unit to have motion primarily only in horizontal direction.

Thus a small displacement (mainly in vertical direction) of the free end of drive plate will cause the end of the first arm of the lever to move in the same direction. This then will cause the end of the second arm to move with larger amplitude but in opposite direction. The second arm, through additional flexible fixtures, drives the function unit of the MEMS device and makes it to move primarily in a horizontal direction. The new motion transducer thus effectively utilizes electrostatic force that is in vertical direction within its motion activation unit to control the horizontal motion of its function unit. Since large driving force in vertical direction in the driving unit can be generated at relatively small voltages, this device is capable to operate at small voltages.

DETAILED DESCRIPTION

Reference Listing

Figure 1:
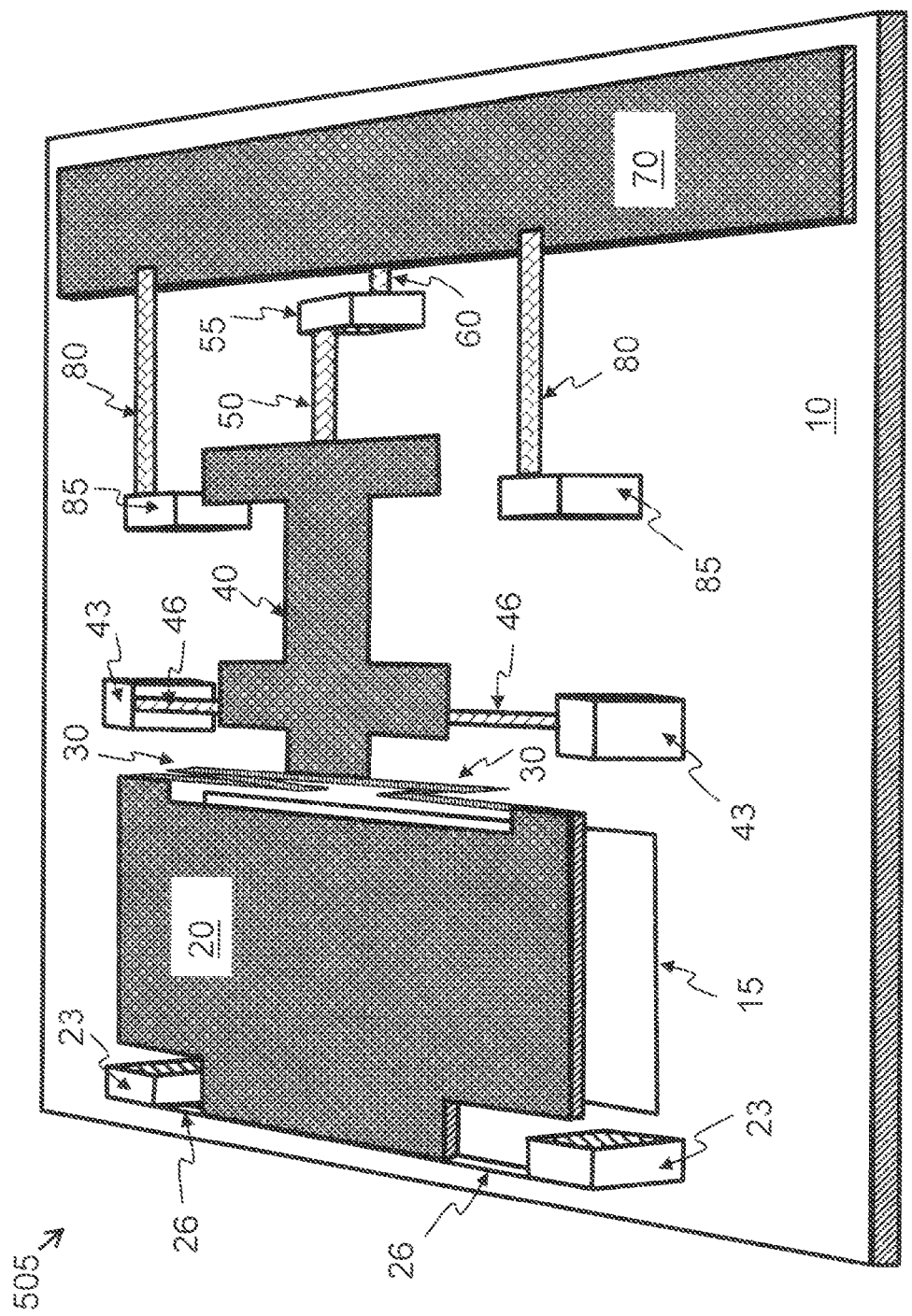
FIG. 1 is a perspective schematic 3-D view of a MEMS motion transducer in its neutral (OFF) position in accordance of the present invention.

10 Base plate
15 Base electrode
20 Drive plate
23 Drive plate support post
26 Drive plate support hinge
28 Coupling posts
30 Coupling spring
40 Lever
43 Lever support post
46 Lever support hinges (or fulcrum)
50 Top coupling spring
55 Joint bar
60 Bottom coupling spring
70 Function plate
71, 72 Additional function plates
80 Motion restriction spring
85 Motion restriction spring supporting post
130 Light groove
405 MEMS shutter in cited reference
505 MEWS shutter of present disclosure Unless otherwise explained, any technical terms used herein have the same meaning as commonly understood by one of ordinary skill in the art to which this disclosure belongs. The singular terms "a," "an," and "the" include plural referents unless the context clearly indicates otherwise. Similarly, the word "or" is intended to include "and" unless the context clearly indicates otherwise. Although methods and materials similar or equivalent to those described herein can be used in the practice or testing of this disclosure, suitable methods and materials are described below. The term "comprises" means "includes". All publications, patent applications, patents, and other references mentioned herein are incorporated by reference in their entirety for all purposes. In case of conflict, the present specification, include explanations of terms, will control. In addition, the materials, methods, and examples are illustrative only and not intended to be limiting.

According to the present invention, a new type of MEMS motion transducer is created. This motion transducer employs electrostatic force in its activation unit to control the motion of its function unit. The electrostatic force in the activation unit is in vertical direction. The motion of the function unit is in horizontal direction, perpendicular to the direction of electrostatic driving force. Thus one aspect of this invention is making use of electrostatic driving force in vertical direction in activation unit to drive the horizontal motion of function unit in a MEMS device.

Since ordinarily, a vertical force can only result a relative movement of the interacting components in vertical direction, another aspect of the present invention comprises using a motion conversion unit to convert the vertical motion in motion activation unit into horizontal motion in function unit of MEMS device.

There are at least several designs using the fundamental aspects of this invention in making the motion transducer. In what follows, two specific designs are described, in part as embodiments of this invention, and also in part to more clearly describe the basic concept of the new motion transducer which is another embodiments of the present invention covering these examples. These examples are not intended to identify the scope of the basic concept of the motion transducer. It should be understood that this invention is not limited to the specific embodiment examples, which will be described subsequently.

One embodiment of this invention of making a horizontal motion transducer 505 is shown in FIG. 1. The motion transducer comprises motion activation unit, a motion conversion unit, and a function unit. In the embodiment example shown in FIG. 1, the motion activation unit comprises a base electrode 15, a drive plate 20, drive plate support hinges 26, and drive plate support post 23. The drive plate is connected through drive plate support hinges 26 to drive plate support posts 23. Drive plate support posts are fixed onto the top of base plate 10 and provide physical support to one end of the drive plate through hinges 26. Hinges 26 are torsional hinges and can primarily have torsional movement. The end of drive plate 20 that is connected to drive plate support hinges 26 cannot move up or down freely, except potentially a very slight movement due to hinge sagging when the drive plate is under the force of electrostatic interaction with base electrode 10. This end of drive plate is referred as the fixed end of drive plate. The other end of drive plate is connected to a motion conversion unit through coupling springs 30. This end of drive plate can move towards base plate 10 when the drive plate is under the force of electrostatic interaction with base electrode 15, and return to its neutral position under hinge restoration force (primarily provided by lever support hinges 46, to be described later) in the absence of the electrostatic force. This end of the drive plate is referred as the free end of drive plate.

The motion conversion unit comprises a lever 40 and several coupling components (top coupling spring 50, joint bar 55, and bottom coupling spring 60). Lever 40 is supported by lever support posts 43 through lever support hinges 46. There are two lever support hinges 46 and two lever support posts 43, symmetrically situated on both sides of lever 40.

Lever 40 is essentially the reverse of a first class lever. An ordinary first class lever generally comprises an effort arm and a load arm, with its effort arm longer than the load arm so that it takes less effort to lift a load. However, in this embodiment example, the function of the lever is for motion conversion, to transfer small vertical motion of the free end of drive plate into larger horizontal motion of function unit of the MEMS device. Therefore the load arm may be longer than the effort arm. To avoid confusion with a typical first class lever, the effort arm and load arm of the lever will only be called first arm and second arm respectively, with second arm longer than the first arm to generate larger amplitude of horizontal motion of function unit. The end of first arm of lever 40 is connected to drive plate through coupling springs 30. The end of second arm is connected to top coupling spring 50, which is connected to bottom coupling spring 60 through joint bar 55. Bottom coupling spring 60 is connected to a function unit of the MEMS device, function plate 70, as illustrated in FIG. 1. Hinges 46 serve as the fulcrum of lever 40 and also provide the primary restoration force that brings the drive plate to its neutral position in the absence of electrostatic driving force within the driving unit. Function plate 70 is the element in the MEMS device that moves primarily in horizontal direction in order to perform certain desired function of the device, to be explained later.

Figure 2:
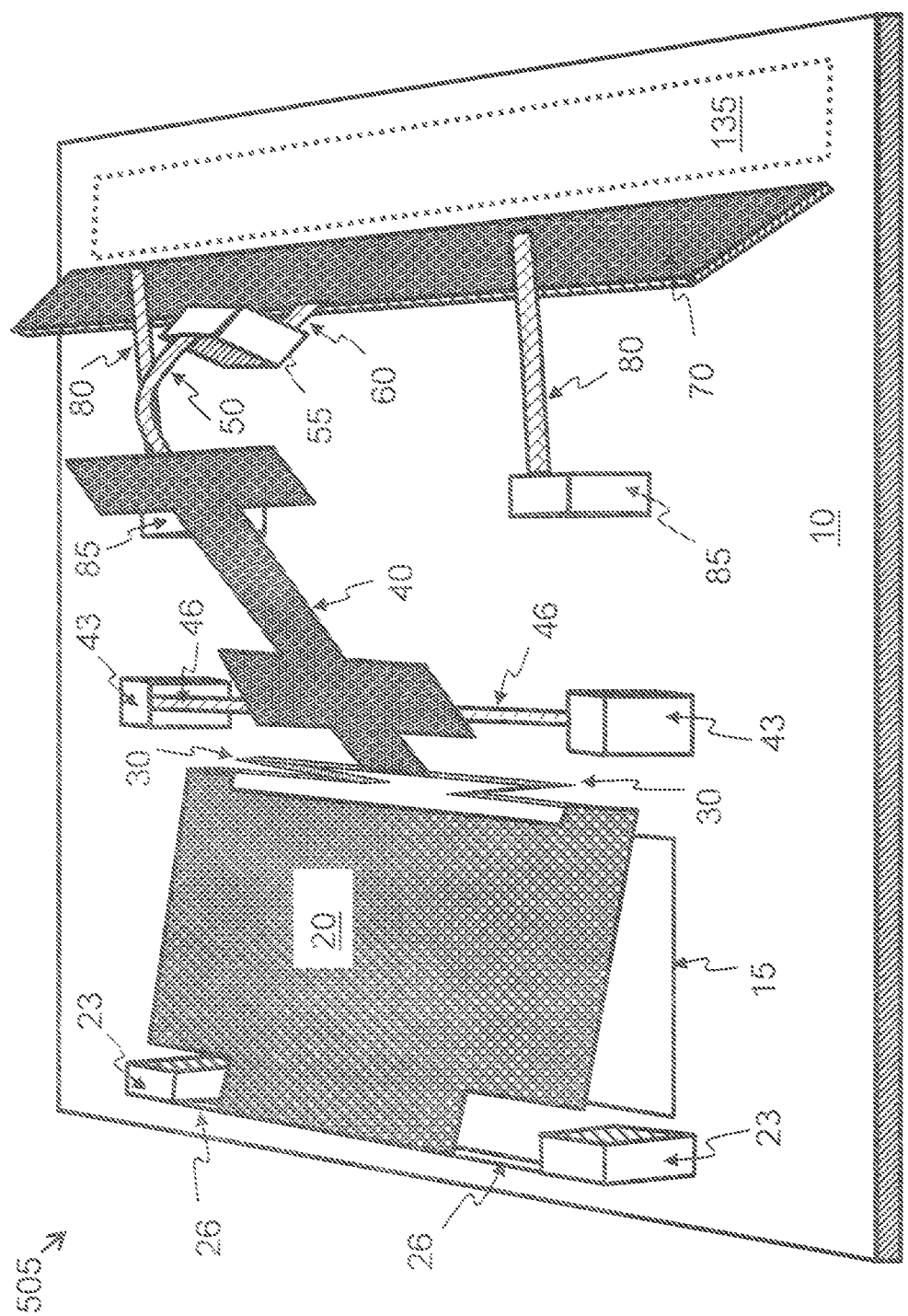
FIG. 2 is a perspective schematic 3-D view of the same motion transducer shown in FIG. 1 but in its energized (ON) position in accordance of the present invention.

Now refers to FIG. 2, when there is an electrostatic potential difference between drive plate 20 and base electrode 15 (i.e., when a voltage is applied across the drive plate and base electrode), there is an electrostatic force pulling the drive plate towards the base electrode. Since the fixed end of drive plate connected to hinges 26 is fixed in space, it cannot move freely except some very slight movement due to the sagging of hinges 26. The free end of drive plate (the end that is connected to coupling springs 30) can move towards the base electrode if the electrostatic force is large enough to overcome hinge restoration force.

The movement of drive plate towards base electrode carries coupling springs 30 to move with it. These coupling springs carry the end of first arm of level 40 to move with the free end of drive plate in the same direction (primarily in downward vertical direction). This in turn causes level 40 to rotate around its fulcrum (lever support hinges 46) and causes the end of its second arm to move with larger amplitude than the end of its first arm, but in an opposite direction. This motion of the second arm, through top coupling spring 50, joint bar 55, and bottom coupling spring 60, and motion restriction springs 80, causes function plate 70 (function unit) to move primarily in horizontal direction (along with some potential internal rotation). The amplitude of horizontal movement of function plate 70 is larger than that of the vertical movement of drive plate 20, FIG. 2.

When the electrostatic force is removed, the free end of drive plate returns to its neutral position under restoration force provided by hinges 46 and 26. This corresponds to the drive plate in its neutral state (OFF position). The state when the free end of drive plate lands close to base electrode under the force of electrostatic interaction between drive plate and base electrode corresponds to the drive plate in an activated state (ON position). Thus between with and without electrostatic driving force, the drive plate swings around its support hinges 26 between its ON and OFF positions.

If without restriction, as lever 40 rotates around lever support hinges 46, function plate 70 would move in a trajectory of an arc along with the end of the second arm, with both vertical and horizontal components of motion. This may be what is needed in some application. In this case, there is no need for the following additional coupling components: top coupling spring 50, joint bar 55, and bottom coupling spring 60; and the function unit can be directly attached to the end of the second arm. But in some applications, it is desirable to confine the function unit to move primary in horizontal direction. For this purpose, motion restriction springs 80 are placed above functional plate 70. This restriction springs are connected to their corresponding support posts placed on top of base plate, called motion restriction spring support posts 85. These motion restriction springs confine the movement of function plate 70 to move primarily in horizontal direction, along with potentially a slight internal rotation.

As previously stated, there can be at least several designs using the basic concept described in this invention to make the motion transducers. Another embodiment of this invention of making a horizontal motion transducer 505 based on the same basic concept is shown in FIGS. 3 and 4.

Figure 3:
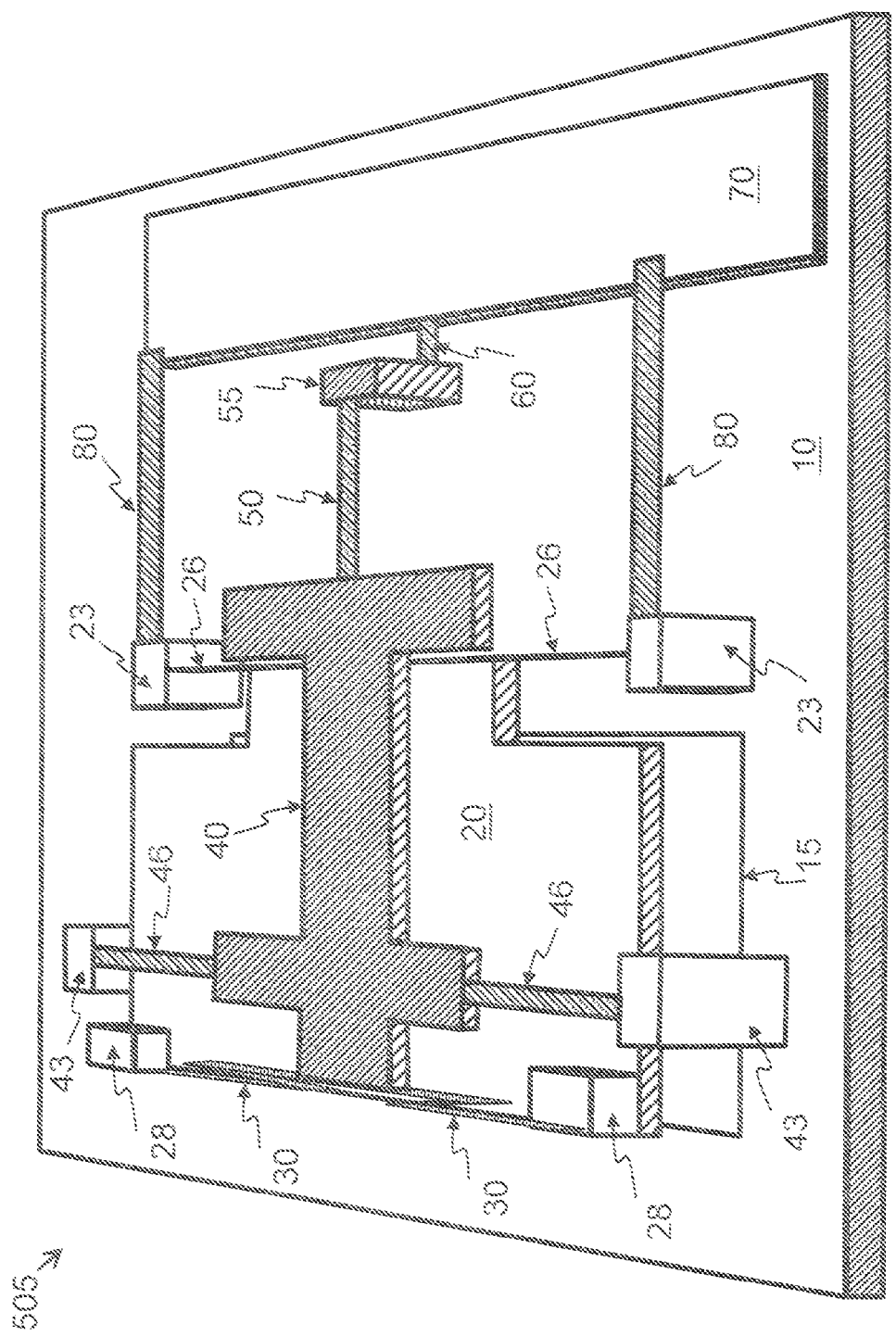
FIG. 3 is a perspective schematic 3-D view of another design of MEMS motion transducer in its neutral (OFF) position in accordance of the present invention.
Figure 4:
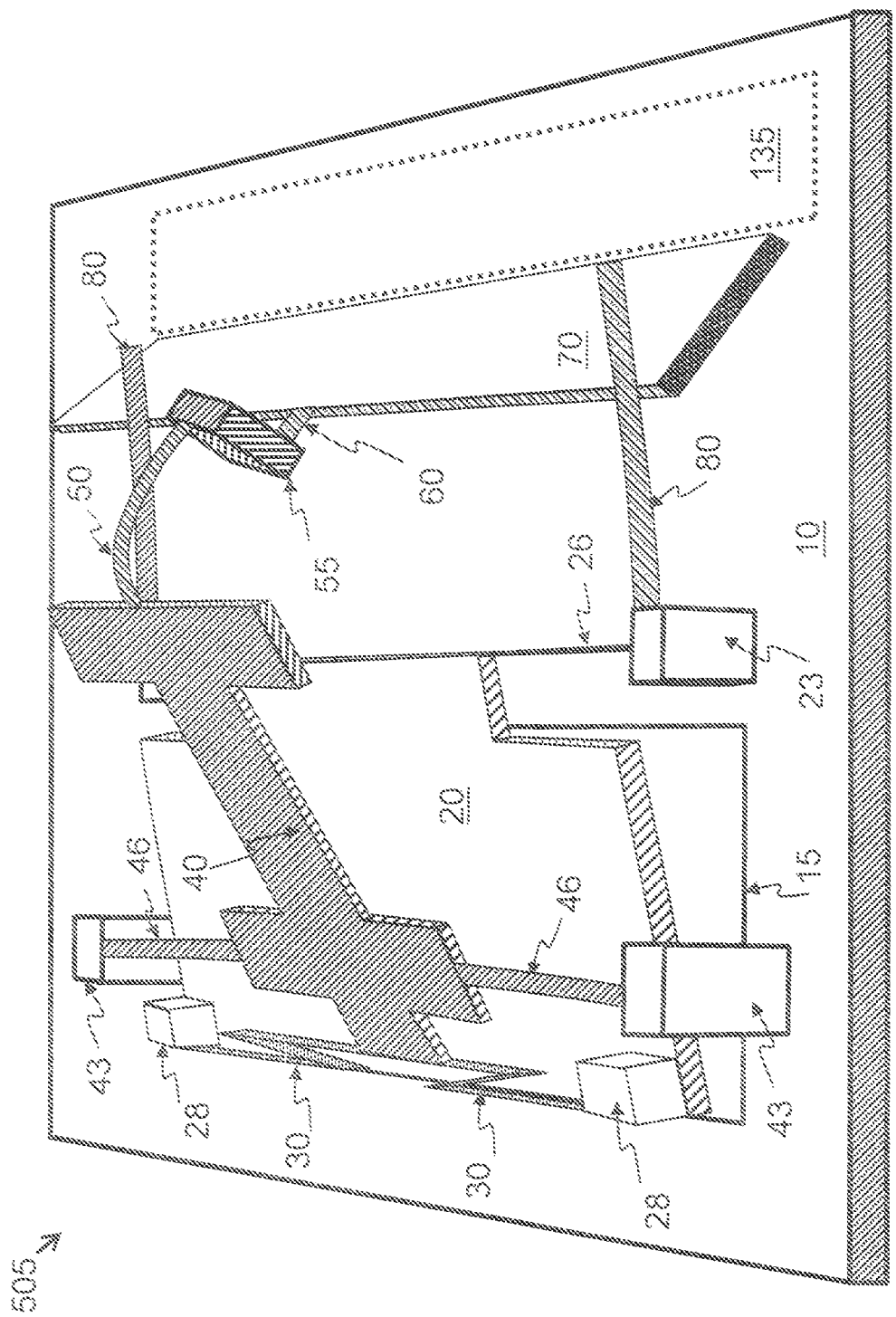
FIG. 4 is a perspective schematic 3-D view of the same motion transducer shown in FIG. 3 but in its energized (ON) position in accordance of the present invention.

In this embodiment of the invention shown in FIGS. 3 and 4, the motion activation unit also comprises a base electrode 15, a drive plate 20, drive plate support hinges 26 and drive plate support post 23. The fixed end of drive plate is connected through drive plate support hinges 26 to drive plate support post 23, which are placed on top of base plate 10 and provide physical support to the fixed end of drive plate. The free end of drive plate is connected to motion conversion unit through coupling springs 30. This end of drive plate can move towards base electrode when under the force of electrostatic interaction with base electrode, and return to its neutral position under restoration force provided by hinges 46 and 26 when electric force is removed. In this design, the fixed end and the free end of drive plate 20 exchanged position compared with the design shown in FIGS. 1 and 2.

Similar to what is shown in FIGS. 1 and 2, motion conversion unit in FIGS. 3 and 4 also comprises a lever 40 and coupling components (top coupling spring 50, joint bar 55, and bottom coupling spring 60). Lever 40 is supported by posts 43 through lever support hinges 46. There are two lever support hinges 46 and two posts 43, symmetrically situated on both sides of lever 40. In this design, the lever is at the level above the drive plate. Coupling posts 28 are used to make connection between coupling spring 30 and drive plate 20. While in the design shown in FIGS. 1 and 2, where the lever and the drive plate are at the same level, coupling posts 28 are not needed and are not present in those figures.

Also similar to what is shown in FIGS. 1 and 2, lever support hinges 46 serves as the fulcrum of lever 40. The first arm of the lever is connected to drive plate through coupling springs 30 and coupling posts 28. The second arm is connected to top coupling spring 50, which is connected to bottom coupling spring 60 through a joint bar 55. Bottom coupling spring 60 is connected to function plate 70, which is the component in the MEMS device that moves primarily in horizontal direction to perform a desired function of the device.

Figure 5:
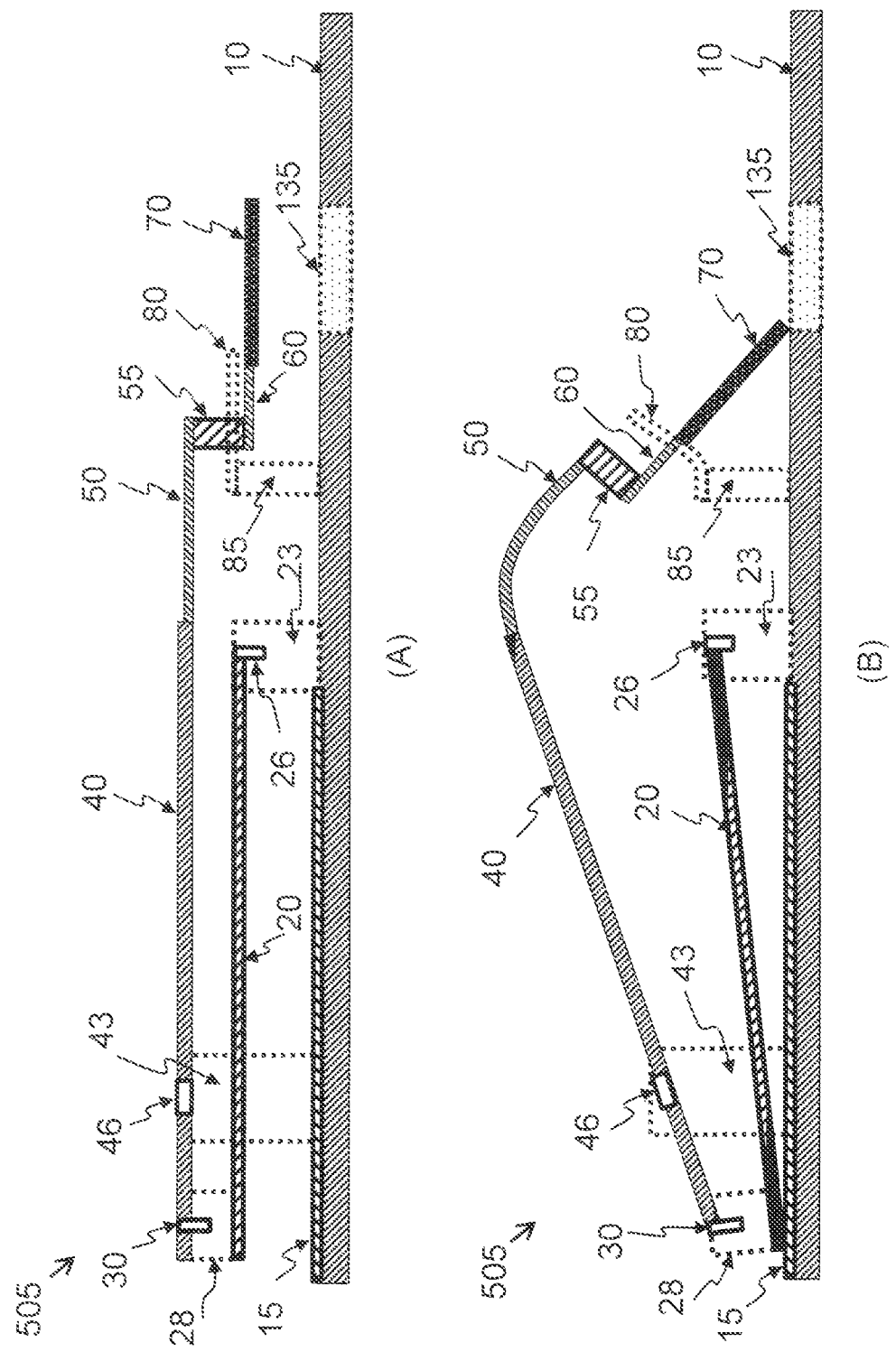
FIG. 5A is a schematic cross section view of the motion transducer shown in FIG. 3 in its neutral (OFF) position.
FIG. 5B is a cross section view of the motion transducer in its energized (ON) position, both in accordance of the present invention.

FIG. 3 corresponds to the mechanical motion transducer in its neutral state (OFF position) and FIG. 4 corresponds to the motion transducer in an activated state (ON position). The working principle of the motion transducer is further illustrated in cross sectional views shown in FIGS. 5A and 5B, correspond to the motion transducers in its neutral state (OFF position, FIG. 3) and in activated state (ON position, FIG. 4), respectively. As shown in FIG. 5B, when under the force of electrostatic interaction with base electrode 15, the free end of drive plate moves towards the base electrode, while the fixed end connected to drive plate support hinges 26 (hidden by drive plate support post 23) stays in place. In the absence of the electrostatic force, hinges 46 and hinges 26 restore the motion transducer to its neutral state, FIG. 5A.

Compared with the design shown in FIGS. 1 and 2, lever in FIGS. 3 and 4 is moved to above drive plate, making more space for expanding the size of drive plate. Thus motion transducers shown in FIGS. 3 and 4 can more effectively use horizontal space to maximize the area of electrostatic interaction between drive plate 20 and base electrode 15, consequently potentially further reduces the voltage needed to activate the motion transducer.

In both types of motion transducers described in previous sections, coupling springs 30 are preferred to have some flexibility of horizontal expansion so that lever 40 and drive plate can move more easily under activation force (the electrostatic force between drive plate and base electrode) without causing substantial sagging of hinges 26 and 46.

Figure 6:
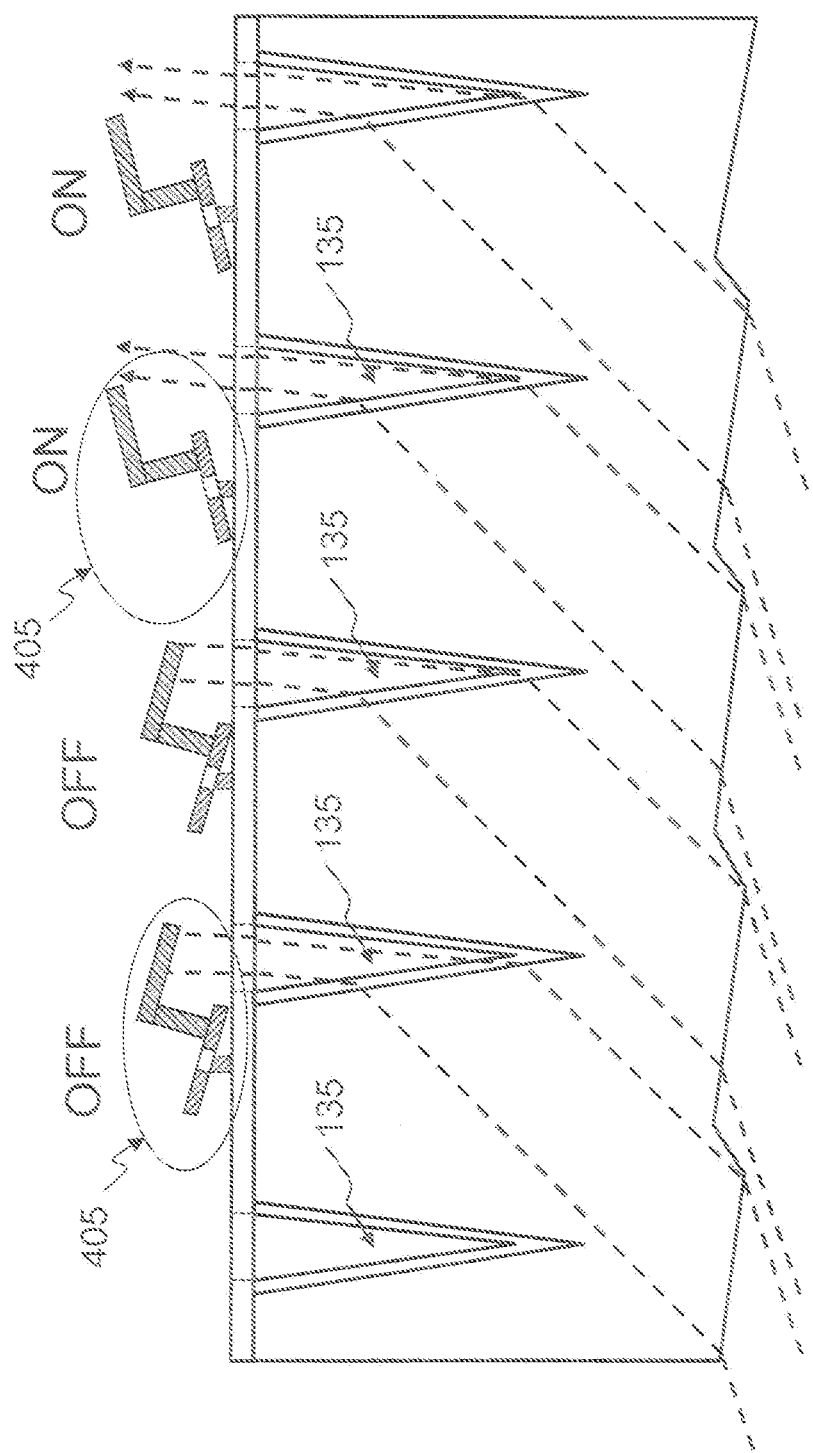
FIG. 6 is a schematic cross section view of a display device using torsional MEMS shutters as described in U.S. Pat. No. 7,995,263 B1.

The function unit, or function plate 70, is the component of MEMS device performing a specific function that requires this component to have relatively large amplitude of horizontal motion. As an example, it can be MEMS light shutters situated above light grooves in a light modulating device, originally described in U.S. Pat. No. 7,995,263 B1. In the referenced disclosure, torsional MEMS shutters were used as an example, as shown in FIG. 6. In this figure, a torsional light shutter 405 is placed above each light groove 135, which corresponds to a pixel or sub-pixel in a display device. As the shutters rotate to their ON state, light within the corresponding grooves 135 is allowed to exit from the groove. When shutters 405 rotate to their OFF state, light within the corresponding groove is blocked off by the shutters and cannot reach to viewer. Thus light intensity at each pixel is modulated by the MEMS shutters. There are some limitations with the use of torsional shutters 405 in the display device. For example, in FIG. 6, light source (not shown) must be placed to the left side of the light modulator. If light source is placed to the right side of the light modulator, substantial amount of the light from the light source will be blocked off by the light shutters even if the shutters are in their ON state. Having light source only placed in one side (left side) of the device may make the view angle of the display substantially skewed unless a light diffuser is used to re-distribute the light to different angles.

Figure 7:
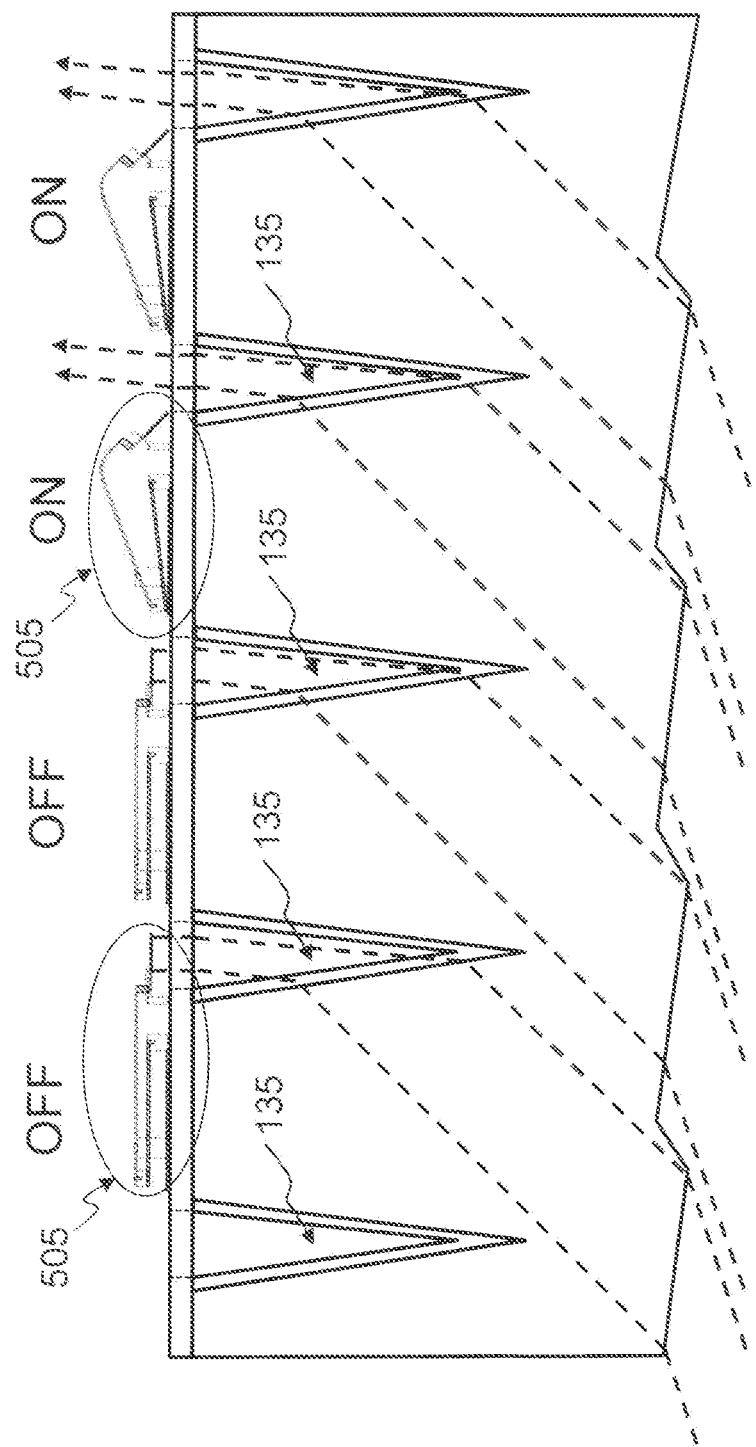
FIG. 7 is a schematic cross section view of a display device using new MEMS shutters described in this invention.

Now, instead of using torsional shutters, if new MEMS shutters described in this disclosure are used as shown in FIG. 7, the problem described above will disappear. Refer to FIGS. 2, 4, 5B and FIG. 7, when the motion transducer is in an activated state (ON position), MEMS shutter (function unit) is moved away from light groove 135. In this case, no matter in which side of the light modulator a light source is placed, light can always exit from light grooves when the corresponding shutters are in their ON position. While in FIGS. 1, 3, 5A, and also in FIG. 7, when the motion transducer is in neutral state (OFF position), MEMS shutter covers up the light groove (thus groove 135 is invisible and not shown in FIGS. 1 and 3). As the motion transducer alternately switches between its neutral state (OFF position, FIGS. 1, 3, and 5) and activated state (ON position, FIG. 2, 4, and 5B), the MEMS shutter either covers up or moves away from light groove 135, acting as an effective light switch in the light modulator described in U.S. Pat. No. 7,995,263 B1.

Figure 8:
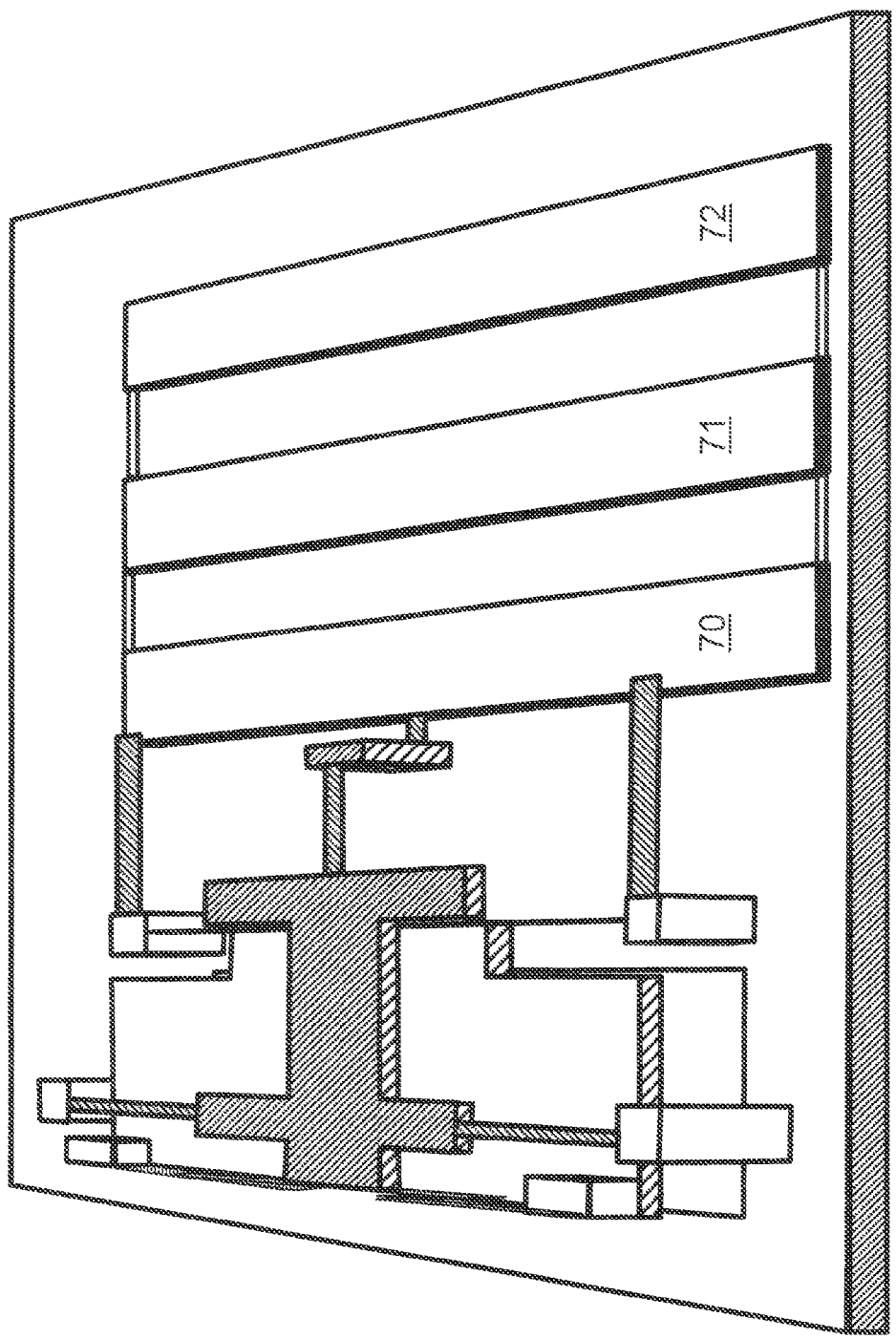
FIG. 8 is a schematic 3-D view of MEMS motion transducer with a three shutters (70, 71, and 72) described in this invention.

As stated previously, function unit 70 is the component of the MEMS device performing a specific function that requires this component to have relatively large amplitude of horizontal motion. The specific design/shape of the function unit is application dependent. It is not limited to the shape schematically shown in previous figures. For example, instead of having one single function plate 70 as shown in FIGS. 1-5, the function unit can also have a structure like a train of plates, as illustrated in FIG. 8, which has three plates 70, 71, and 72, to act as shutters for three corresponding light grooves. The shutters can take other shapes as fit in their specific application. Therefore the scope of this invention is not limited by the specific shape of the shutters described in the embodiment examples. Likewise, the scope of this invention is also not limited by the specific shape of other components of the motion transducer, including the shape of drive plate, lever, motion coupling components (include motion restriction springs), hinges and posts, and not limited to their specific positions with respect to one another.

What is claimed is:

1. A micro-electric-mechanical motion transducer comprising:
    (1) a base plate; and
    (2) a motion activation unit; and
    (3) a motion conversion unit; and
    (4) a function unit; and
    (5) a coupling means between the motion activation unit and the motion conversion unit, and the between motion conversion unit and the function unit.

2. The motion transducer according to claim 1, wherein the direction of motion or displacement of the function unit is perpendicular to the direction of driving force in the motion activation unit.

3. The motion transducer according to claim 1, wherein the motion activation unit further comprises:
    (1) at least one base electrode; and
    (2) at least one drive plate with drive plate supporting posts; and
    (3) torsional hinges.

4. The motion transducer according to claim 1, wherein the motion conversion unit further comprises:
    (1) one or more levers; and
    (2) one or more top coupling springs; and
    (3) one or more joint bars; and
    (4) one or more bottom coupling springs; and
    (5) a plurality of motion restriction springs and posts therefor.

5. The motion transducer according to claim 1, wherein the coupling means between the motion activation unit and the motion conversion unit is at least one spring.

6. The motion transducer according to claim 1, wherein the motion transducer employs electrostatic force in the motion activation unit to control motion or displacement of the function unit.

7. The motion transducer according to claim 1, wherein a drive plate of the motion activation unit is caused to move or displace in a vertical direction perpendicular to the base plate.

8. The motion transducer according to claim 1, wherein the movement or displacement of the function unit is substantially in a horizontal direction parallel to the base plate.

9. The motion transducer according to claim 1, wherein the motion conversion unit converts vertical movement or displacement of a drive plate of the motion activation unit into horizontal movement or displacement of the function unit.

10. The motion transducer according to claim 1, where the function unit is capable of internal rotation.

* * * * *